(12) United States Patent
Moriarty

(10) Patent No.: US 7,058,092 B1
(45) Date of Patent: Jun. 6, 2006

(54) TWENTY GIGABIT PER SECOND TWO TO ONE MULTIPLEXOR

(75) Inventor: Daniel T. Moriarty, Hudson, MA (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 1001 days.

(21) Appl. No.: 10/041,588

(22) Filed: Jan. 10, 2002

(51) Int. Cl.
*H04J 3/02* (2006.01)
(52) U.S. Cl. ........................ 370/537; 370/366
(58) Field of Classification Search ............... 370/530, 370/535, 537, 538, 539, 540; 375/260, 299, 375/295, 297, 316, 377
See application file for complete search history.

(56) References Cited

U.S. PATENT DOCUMENTS

2003/0027586 A1* 2/2003 Johnson et al. ............. 455/517

* cited by examiner

*Primary Examiner*—Brian Nguyen
(74) *Attorney, Agent, or Firm*—William G. Auton

(57) ABSTRACT

The present invention includes a design for a 20-gigabit per second two to one multiplexor, that uses: first and second input amplifiers that respectively provide output signals by respectively receiving and amplifying first and second ten-gigabit per second input signals; first and second power dividers that each produce two output data streams by respectively splitting the output signals of the first and second input amplifiers; first and second mixers that produce output signals by respectively mixing output signals of the first and second power dividers with a 10 GHz local oscillator signal; a second means for combining signals that produces an output signal by combining the output signal of the second mixer with an output data stream of the second power divider; a T/2 delay line that produces an output signal by delaying the output signal of the second combining means; and an output combiner means that outputs a 20-gigabit per second data stream by combining the output signal of the T/2 delay line with the output signal of the first combining means.

1 Claim, 3 Drawing Sheets

FIGURE 3

| Data | Clock | |
|---|---|---|
| 1 | 1 | -1 |
| 0 | 1 | -1 |
| 0 | 0 | 0 |

- Logic diagram resulting from mixer
- Three output states

FIGURE 2

| Data | Clock | |
|---|---|---|
| 1 | 1 | 0 |
| 0 | 1 | 0 |
| 0 | 0 | 0 |

- Logic Diagram resulting from And gate
- Two output states

- Reduce to two states by adding original data stream
- Two output levels
- Effects NRZ to RZ conversion

TWENTY GIGABIT PER SECOND TWO TO ONE MULTIPLEXOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to digital data stream and more specifically to a digital multiplexor design. Digital multiplexors can be used to select an output between two or more input data streams. They may also be used as a parallel to serial converter by sequentially selecting between each of the inputs. They are typically built from an arrangement of digital building blocks, And gates and inverters. The technology used to build the gates and inverters are typically bipolar transistors (BJTs) for speeds below 100 MHz, heterojunction bipolar transistors (HBTs) for speeds up to a GH/z and, gallium arsenide high electron-mobility transistor field effect transistors (GaAs HEMT FETs). The present state of the art digital chip employing GaAs HEMT FETs can run at 10 GB/s reliably and, at extreme costs ($100 k or more) 20 GB/s.

Current digital multiplexor technology is described in the following U.S. patents, the disclosures of which are incorporated herein by reference:

U.S. Pat. No. 5,627,991 issued to Hose,
U.S. Pat. No. 5,862,408 issued to Dey;
U.S. Pat. No. 6,065,070 issued to Johnson; and
U.S. Pat. No. 5,635,857 issued to Flora.

The Hose reference discloses a cache memory with a two to one multiplexor assembly to process data chunks. Communication systems employing analog or digital radio frequency (RF) hardware has been capable of frequencies above 44 GHz Q-band) for many years. Recent advances in optical technologies has allowed for development of digital system test beds exceeding 100 GB/s. A need has arisen for high data rate sources and receivers to test systems at more than 10 GB/s.

SUMMARY OF THE INVENTION

The present invention is a twenty gigabit per second two to one multiplexor. This invention uses first and second input amplifiers that respectively produce output signals by respectively receiving and amplifying first and second ten-gigabit per second input signals.

Next, first and second power dividers each produce two output data streams by respectively splitting the output signals of the first and second input amplifiers.

Next, first and second mixers produce output signals by respectively mixing, output signals of the first and second power dividers with a 10 GHz local oscillator signal.

Next, a first means for combining signals produces an output signal by combining the output signal of the first mixer with an output data stream with the first power divider.

Also, a second means for combining signals produces an output signal by combining the output signal of the second mixer with an output data stream of the second power divider.

Next, a T/2 delay line that produces an output signal by delaying the output signal of the second combining means.

Finally, an output combiner means outputs a 20-gigabit per second data stream by combining the output signal of the T/2 delay line with the output signal of the first combining means.

It is an object of the invention to provide a design for a 20-gigabit per second two to one multiplexor.

These and many other objects and advantages of the present invention will be readily apparent to one skilled in the pertinent art from the following detailed description of a preferred embodiment of the invention and related drawings.

DESCRIPTION OF THE DRAWINGS

FIG. 2 is a logic diagram of the And gates used in FIG. 1;
FIG. 3 is a logic diagram of the outputs of the mixer elements of FIG. 1.

DETAILED DESCRIPTION OF THE PREFERRED EMBODIMENT

Figure 1:
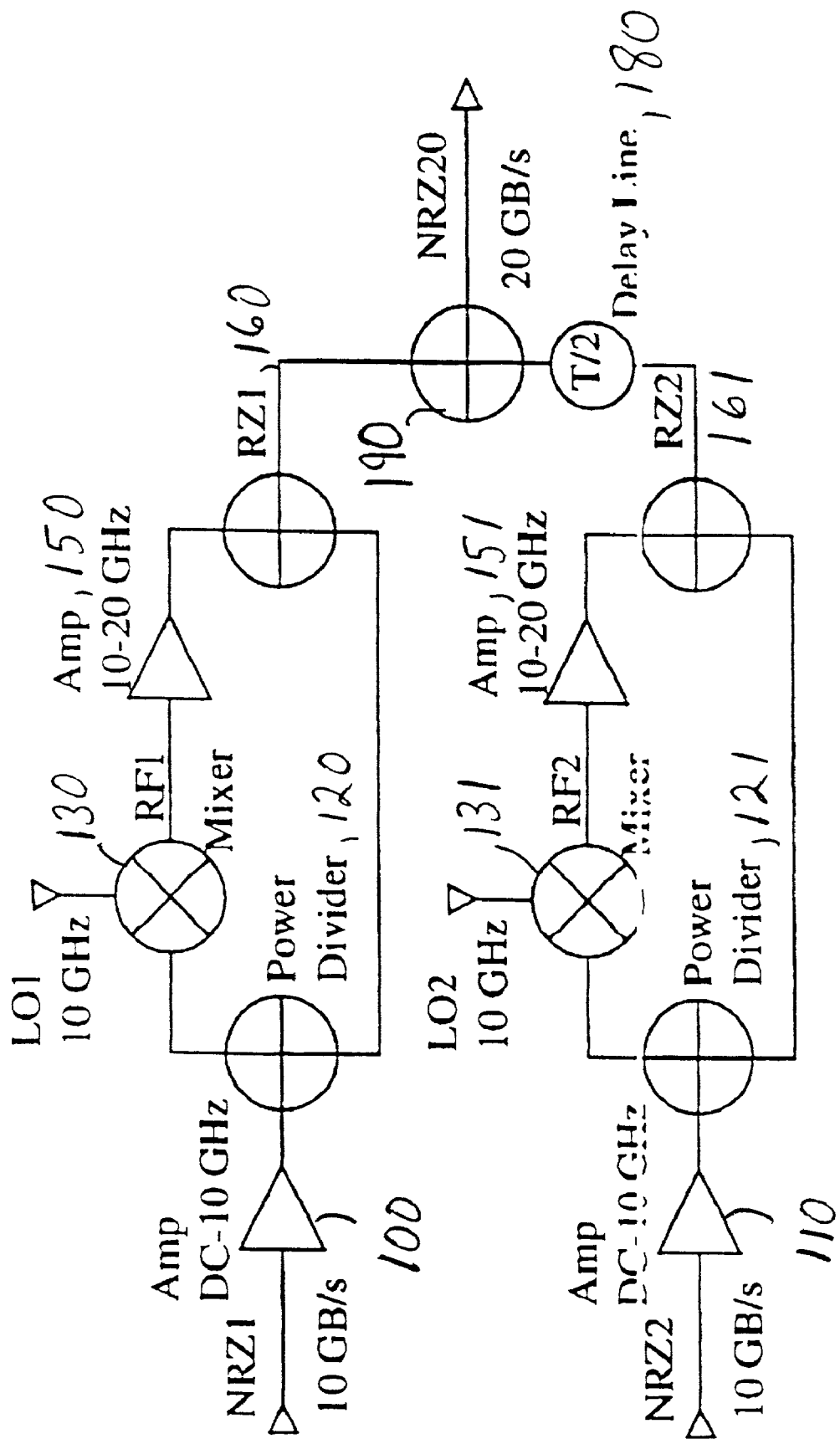
FIG. 1 is a block diagram of the multiplexor.

The present invention includes a design for a 20-gigabit per second two to one multiplexor, as shown in FIG. 1.

By employing standard high-speed RF techniques, a 20 GB/s multiplexor (MUX) has been designed. Two 10 GB/s non-return-to-zero (NRZ) signals are each converted to return-to-zero (RZ) with the use of millimeter wave mixers and properly level shifted by combining with the original NRZ signals. An output 20 GB/s NRZ signal is created by passively combining the Two RZ signals delayed one 20 GB/s bit period with respect to each other.

Two 20 GB/s signals may be Mux'ed into a single 40 GB/s signal using the same technique.

The multiplexor of FIG. 1 receives two 10 gigabit per second data streams using first and second input amplifiers 100 and 110. Amplified data stream signals are each split into two streams by a pair of power dividers 120 and 121.

A first amplified data stream is combined with a 10 GHz signal from a local oscillator by a first radio frequency mixer 130 to produce a first combined signal. Similarly, a third amplified data stream is combined with a 10 GHz signal from a second local oscillator to by a second radio frequency mixer 131 produce a second combined signal. The first and second combined signals are amplified by first and second amplifiers 150 and 151.

Data stream combiners 160 and 161 produce outputs by combining signals from amplifiers 150 and 151 with the second and fourth data streams from dividers 120 and 121.

The output combiner 190 combines signals it receives from the data stream combiner 160 and the data stream combiner 161 though a delay line 180 into the multiplexed 20 gigabit per second output signal, the delay line 180 delays its output signals by one half a cycle. As described above, two 10 GB/s data streams may be multiplexed with the use of And gates. During the first half of a clock cycle one data stream is enabled while the other is disabled and visa versa for the second half-cycle.

Twenty GB/s digital chips are not available and cost effective.

A mixer can be used to effect part of the features of an And gate by multiplying a data stream by one during the first half-cycle and by zero during the second half-cycle.

Unfortunately mixers are not fabricated with more than one DC coupled port. This effectively forces the multiplication to be by 1 and −1. The result is the existence of three states: 1, 0, and −1.

Figure 4:
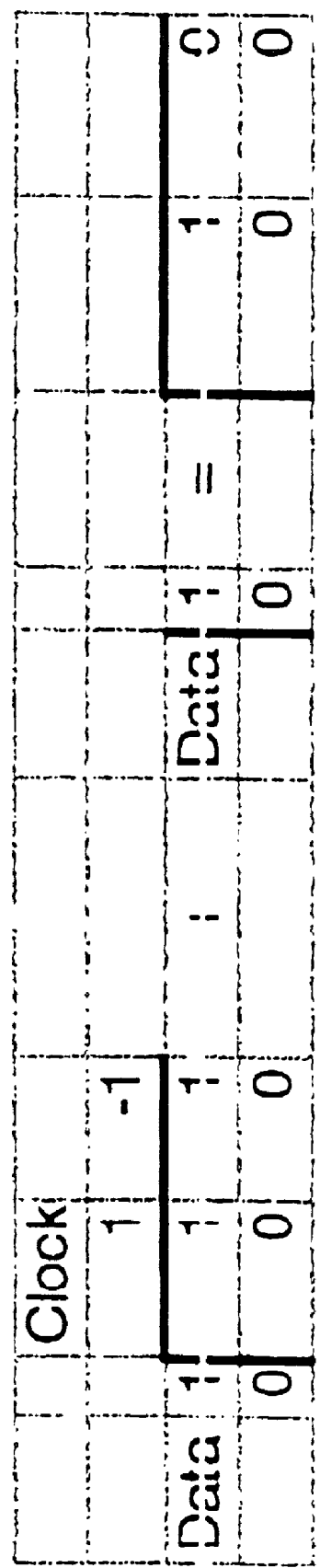
FIG. 4 is a logic diagram of the multiplexor of FIG. 1.

FIGS. 2 and 3 are the logic diagrams of the outputs of the And gates and mixers used in FIG. 1. FIG. 4 is the logic diagram of the output of the multiplexor of FIG. 1. FIG. 1 is useable with commercially available system such as that of Terrabit Technologies high speed optical transmission equipment; Hewlett-Packard who make 10 GB/s bit error rate detectors (BERTs); SHF who makes a 4:1 40 GB/s Mux, Anritsu-Wiltron who make 15 GB/s BERTs, and Lucent Technologies who produce high speed communication systems.

FIG. 1 converts 10 GB/s outputs and uses passive combiners and delay lines to mix signal streams.

The system of FIG. 1 performs NRZ to RZ conversion to two 10 GB/s data streams by a phase delay of one stream by one 20 GB/s bit time and combining signals. The power combiners can be DC coupled and are available at extreme bandwidths.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A twenty-gigabit per second two to one multiplexor comprising:

first and second input amplifiers that respectively produce output signals by respectively receiving and amplifying first and second ten-gigabit per second input signals;

first and second power dividers that each produce two output data streams by respectively splitting the output signals of the first and second input amplifiers;

first and second mixers that produce output signals by respectively mixing output signals of the first and second power dividers with a 10 GHz local oscillator signal;

a first means for combining signals that produces an output signal by combining the output signal of the first mixer with an output data stream with the first power divider;

a second means for combining signals that produces an output signal by combining the output signal of the second mixer with an output data stream of the second power divider;

a T/2 delay line that produces an output signal by delaying the output signal of the second combining means; and an output combiner means that outputs a 20-gigabit per second data stream by combining the output signal of the T/2 delay line with the output signal of the first combining means.

* * * * *